(12) United States Patent
Rye et al.

(10) Patent No.: US 9,864,283 B2
(45) Date of Patent: Jan. 9, 2018

(54) APPARATUS AND METHODS FOR PHOTOMASK BACKSIDE CLEANING

(71) Applicant: APPLIED Materials, Inc., Santa Clara, CA (US)

(72) Inventors: Jason Rye, Kalispell, MT (US); Kyle Moran Hanson, Kalispell, MT (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 14/945,319

(22) Filed: Nov. 18, 2015

(65) Prior Publication Data
US 2017/0139334 A1  May 18, 2017

(51) Int. Cl.
*B08B 11/02* (2006.01)
*G03F 7/20* (2006.01)
*H01L 21/687* (2006.01)

(52) U.S. Cl.
CPC .......... *G03F 7/70925* (2013.01); *B08B 11/02* (2013.01); *G03F 7/707* (2013.01); *H01L 21/68728* (2013.01)

(58) Field of Classification Search
CPC ..... B08B 11/02; G03F 7/707; G03F 7/70925; H01L 21/68728
USPC ................................ 134/153, 157, 200, 902
See application file for complete search history.

(56) References Cited

U.S. PATENT DOCUMENTS

| | | | |
|---|---|---|---|
| 5,513,594 A | 5/1996 | McClanahan et al. | |
| 6,063,208 A | 5/2000 | Williams | |
| 6,829,035 B2 | 12/2004 | Yogev | |
| 7,673,637 B2 | 3/2010 | Pan | |
| 7,927,969 B2 | 4/2011 | Martin | |
| 8,002,899 B2 | 8/2011 | Wu | |
| 8,578,953 B2 | 11/2013 | Takiguchi et al. | |
| 2002/0127956 A1 | 9/2002 | Ashjaee et al. | |
| 2005/0274397 A1 | 12/2005 | Chao | |
| 2008/0041429 A1* | 2/2008 | Pan | G03F 1/82 134/165 |
| 2008/0041760 A1 | 2/2008 | Durben et al. | |
| 2010/0078039 A1 | 4/2010 | Wu | |

(Continued)

FOREIGN PATENT DOCUMENTS

| | | |
|---|---|---|
| CN | 202189222 U | 4/2012 |
| JP | H05281707 A | 10/1993 |
| JP | 10-125641 A | 5/1998 |

OTHER PUBLICATIONS

Perissinotti, et al., Francesca, "Back-Glass cleaning: reducing repelliclization costs by focused action", SPIE 7488 2M (2009).

(Continued)

*Primary Examiner* — Levon J Shahinian
(74) *Attorney, Agent, or Firm* — Perkins Coie LLP; Kenneth H. Ohriner

(57) ABSTRACT

Apparatus for cleaning a photo mask includes a rotor in a head, with the rotor having a seal plate having a central opening, a resilient mask seal in the central opening, and retractors attached to the resilient mask seal and adapted to move the resilient mask seal into open and closed positions. A motor in the head rotates the rotor. A push plate in the head moves to operate the retractors. In the closed position the resilient mask seal seals against the sides of the photo mask. The back side of the photo mask can then be cleaned without affecting the patterned front side of the photo mask.

17 Claims, 5 Drawing Sheets

(56) References Cited

U.S. PATENT DOCUMENTS

2012/0050711 A1    3/2012  Hillman
2012/0237703 A1    9/2012  Hedges
2014/0137347 A1    5/2014  Pan

OTHER PUBLICATIONS

International Application Division, Korean Intellectual Property Office, "The International Search Report and the Written Opinion" issued in International Application No. PCT/US2016/061393 dated May 4, 2017.

* cited by examiner

APPARATUS AND METHODS FOR PHOTOMASK BACKSIDE CLEANING

BACKGROUND OF THE INVENTION

Photolithography is used in manufacturing microelectronic devices to form precise patterns on a substrate surface. A photo mask or reticle generally is a square plate of transparent material, such as glass or fused silica. The photomask is initially created with the pattern to be transferred to the substrate, such as a semiconductor wafer. With subsequent processing steps, the patterned substrate surface forms the desired micro or nano scale electronic devices or features. A photo mask may be repeatedly used to imprint thousands of substrates. In use the back side may become contaminated by scratches, burrs or particles, which degrades the photo mask. Techniques for cleaning the back side have been proposed. However, while cleaning the back side, it is necessary to avoid affecting the patterned front side of the photo mask. This presents various engineering challenges. According, improved apparatus and methods are needed for photo mask back side cleaning.

SUMMARY OF THE INVENTION

In a first aspect, apparatus for cleaning a photo mask includes a rotor in a head, with the rotor having a seal plate having a central opening, a resilient mask seal in the central opening, and retractors attached to the resilient mask seal and adapted to move the resilient mask seal into open and closed positions. A motor in the head rotates the rotor. A push plate may be provided in the head, with linear movement of the push plate adapted to operate the retractors. In the closed position the resilient mask seal seals against the sides of the photo mask. The back side of the photo mask can then be cleaned without affecting the patterned front side of the photo mask.

DETAILED DESCRIPTION

Figure 1:
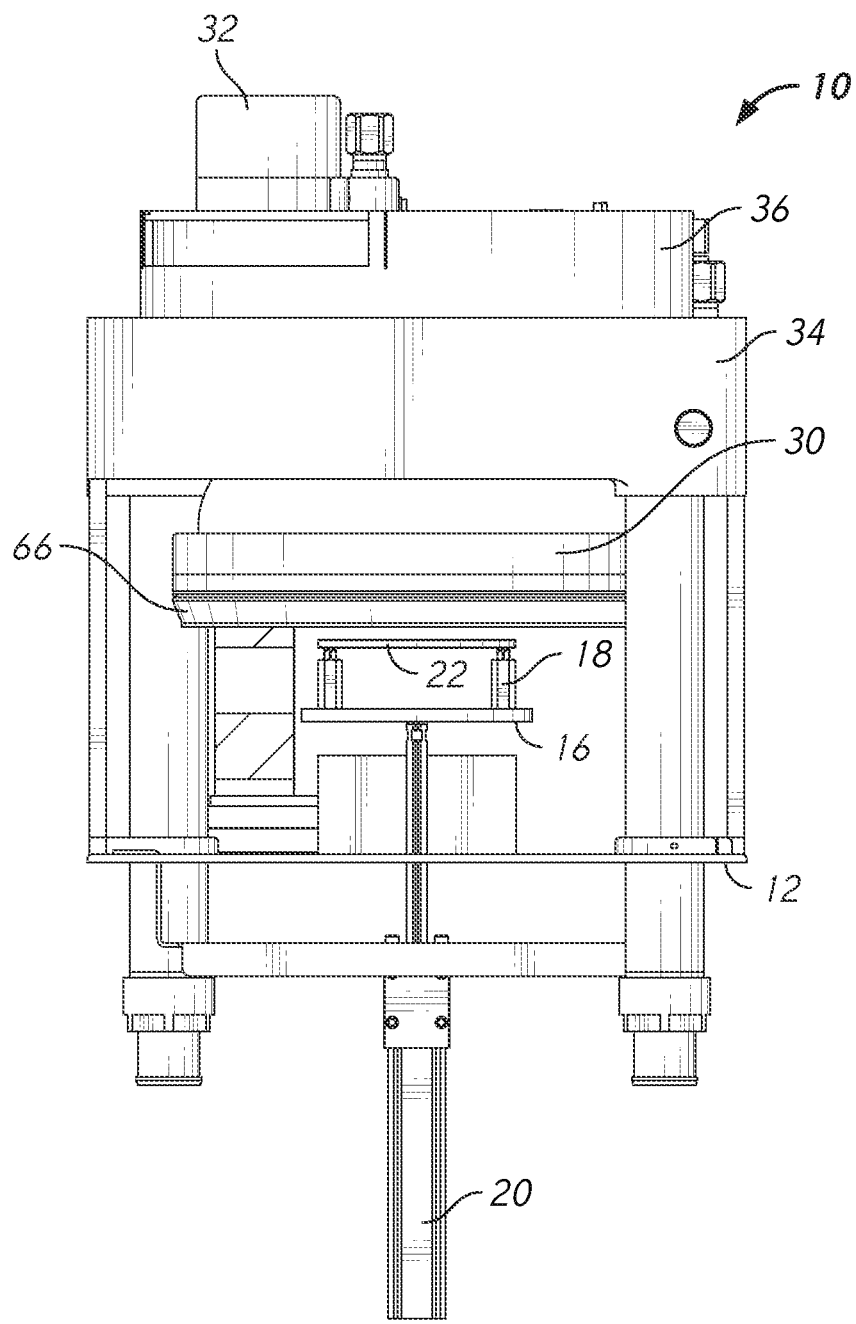
FIG. 1 is a side view of a photo mask back side cleaning apparatus.
Figure 2:
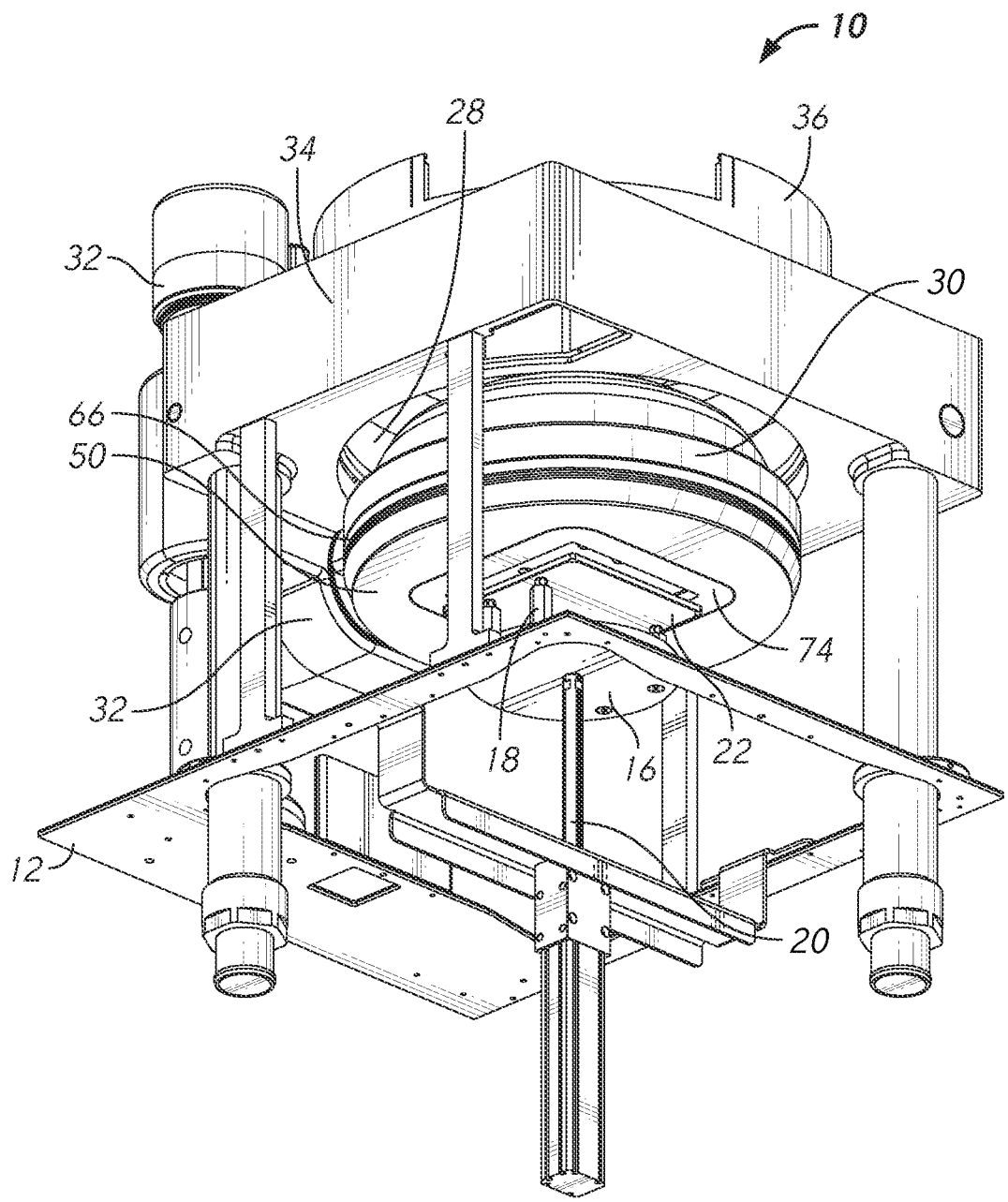
FIG. 2 is a bottom perspective view of the apparatus of FIG. 1.
Figure 3:
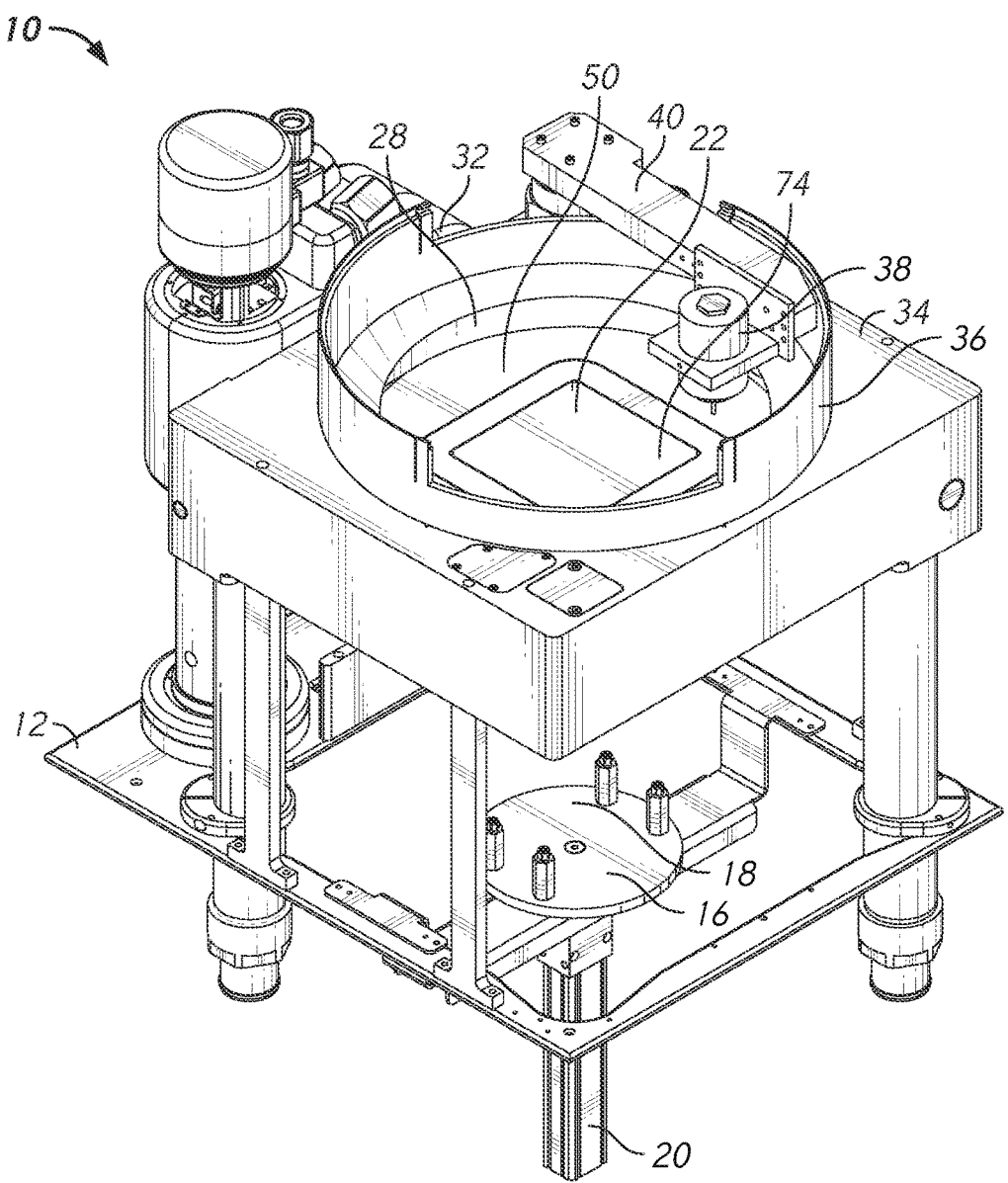
FIG. 3 is a top perspective view of the apparatus of FIG. 1.
Figure 4:
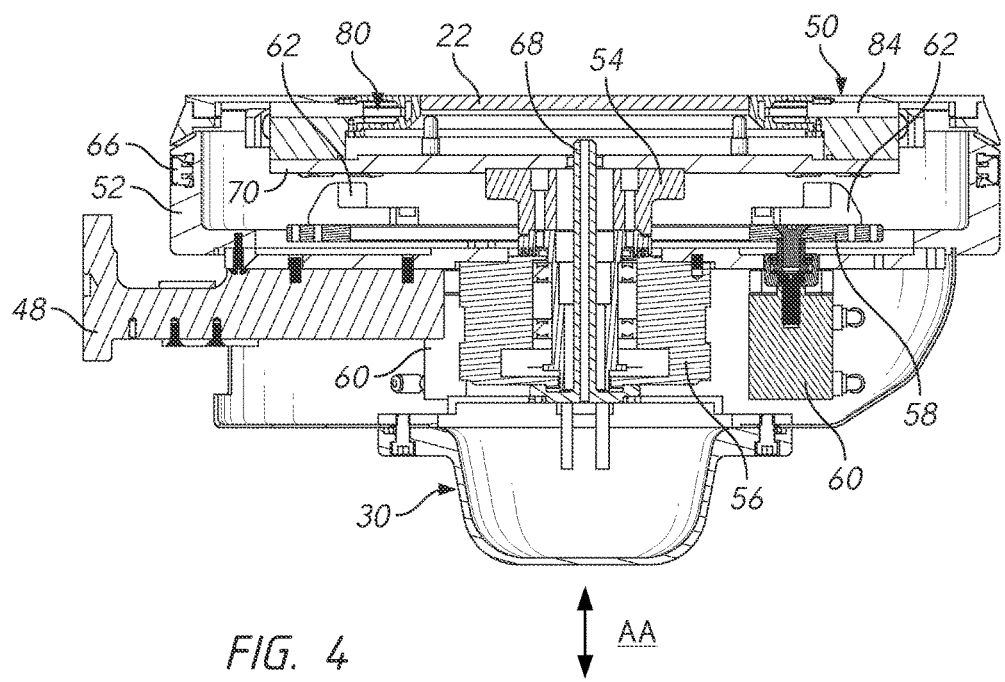
FIG. 4 is a section view of the head shown in FIGS. 1 and 2.
Figure 5:
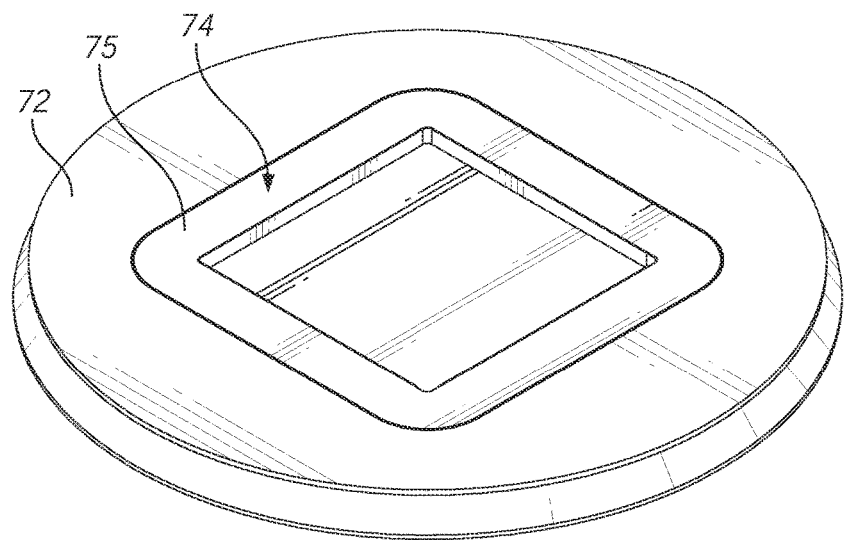
FIG. 5 is a top perspective view of the rotor shown in FIG. 4.

As shown in FIGS. 1-3, a photo mask cleaning apparatus 10 includes a base plate 12 which may be mounted onto a deck of a processing system having multiple other processing apparatus or modules and one or more robots for moving work pieces among the modules. Pins 18 on a holder 16 are adapted to support a photo mask 22. The holder may be supported on a lifter 20 which is movable vertically and lifts and lowers the holder 16, as further discussed below. Referring now also to FIG. 4, a head 30 has a rotor housing 52 and an arm 48 attached to a lift/rotate 32. The lift/rotate 32 is operable to lift and lower the head 30, and also rotates the head 30 into the face-down position shown in FIGS. 1-2 and into the face-up position shown in FIGS. 3-4. A frame 34 supported at a fixed position above the base plate 12 has a chamber sidewall 28 which is cylindrical and has a diameter nominally larger than the diameter of the head 30. An inflatable seal 66 on the head 30, for example an inflatable seal, engages and seals against the chamber sidewall 28 during the cleaning process when the head is in the face-up position or process position to form a processing chamber. With the inflatable seal 66 engaged against the chamber sidewall 28, a chamber or vessel is temporarily provided around the rotor. Other forms of seals, including seals that do not inflate, and seals on the chamber sidewall rather than on the head, may alternatively be used. As shown in FIG. 3, a liquid spray nozzle 38, such as an ultrasonic nozzle, is mounted on a swing arm 40. A shield 36 may project up above the frame 34 to better contain cleaning liquid spray within the apparatus.

As shown in FIG. 4, a shaft plate 70 of a rotor 50 in the head 30 is attached to a shaft 54 which is attached to a motor 56. A gas nozzle 68 may extend through the center of the shaft plate 70 to provide gas into the rotor. Alternatively the rotor 50 may have one or more gas ports at other positions. One or more actuators 60 in the head are positioned to move a push plate 58 in the axial direction AA in FIG. 4. Ramps 62 are attached to the top surface of the push plate 58. In the example shown, three pneumatic linear actuators 60 and four ramps 62 equally spaced apart are used. As used here, up or top refers to the apparatus in the processing position as shown in FIGS. 3, 4 and 7.

Referring to FIGS. 4-7, the rotor 50 has a seal plate 72 attached to the shaft plate 70. The seal plate 72 has a central opening matching the shape of the photo mask 22, which is square in the example shown. A resilient mask seal 74 is positioned in the central opening and has an upper rim 75 forming a seal with the seal plate 72 and a lower rim 85 forming a seal with or to the shaft plate 70. The upper rim 75 may be clamped between the seal plate 72 and the shaft plate 70. The lower rim 85 may be attached to the shaft plate 70 via a lower seal frame 76.

Figure 6:
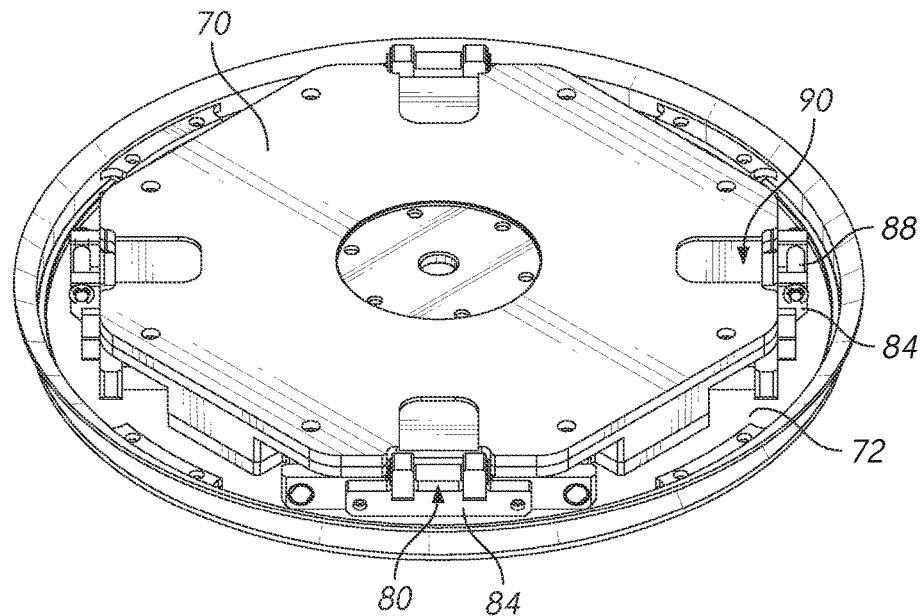
FIG. 6 is a bottom perspective view of the rotor shown in FIG. 4.
Figure 7:
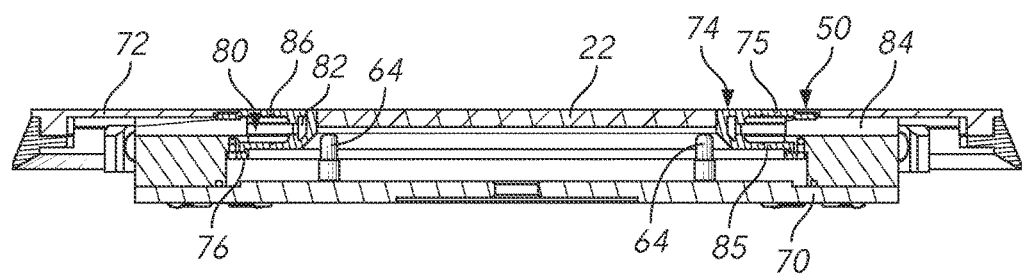
FIG. 7 is an enlarged section view of the rotor of FIG. 4 removed from the head.

Turning to FIGS. 4, 6 and 7, first, second, third and fourth retractors generally indicated at 80 are provided on the shaft plate 70, with each retractor 80 positioned to retract the first, second, third and fourth straight sides of the resilient mask seal 74. Each retractor frame 80 has an inner end and an outer end, and with a retractor bar at the inner end attached to the resilient mask seal, An inner end of a retractor bar 82 is attached to one side of the resilient mask seal 74. The resilient mask seal 74 may be a molded rubber seal, with the retractor bars 82 secured within a channel of the resilient mask seal, and/or with the retractor bars 20 adhered to or embedded in the resilient mask seal 74. The outer end of each retractor bar 82 is attached to or part of a retractor frame 84. As shown in FIG. 6, a roller 88 may be provided at the outer end of each retractor frame 84. The rollers 88 are adapted for engagement by the ramps 62 moving in an axial direction perpendicular to the radial direction. Alternatively, a complimentary ramp may be used on the retractor frames instead of the roller. The retractors 80 are movable radially inwardly or outwardly on the shaft plate 70, i.e. along a radial direction or axis through the center of the rotor, but are otherwise fixed in place on the shaft plate 70. As shown in FIG. 7, each retractor 80 includes a compression spring 86 which continuously urges the retractor frame 84 radially inward. Alternatively, the retractors may be moved via one or more actuators on the shaft plate 70 and the compression spring 86 may be omitted.

Corner posts 64 may project up from the shaft plate 70 at the corners of the resilient mask seal 74.

In use, a photo mask 22 to be cleaned is placed onto the pins 18 of the holder 16 as shown in FIG. 1. The patterned or front side of the photo mask 22 is face up. As shown in FIG. 2, initially the head 30 is face-down. The rotor 50 is moved into the open position via the actuators 60 moving the push plate 58 towards the rotor 50. The ramps 62 pass through ramp slots 90 in the shaft plate 70 and push the rollers 88 simultaneously radially outwardly. This moves the retractor frames radially outwardly which stretches the resilient mask seal 74 outwardly, typically from 0.5 to 5 mm. The inside dimensions of the resilient mask seal 74, in the stretched or open position, are then nominally larger than the photo mask 22, so that the photo mask 22 can fit within the resilient mask seal 74.

The motor 56 rotates the rotor 50 as needed to align the resilient mask seal 74 with the photo mask 22. After proper alignment is detected by a sensor, the lifter 20 lifts the holder 16 up vertically to position the photo mask 22 for transferring to the rotor by positioning the photo mask 22 within the resilient mask seal 74, while the rotor 50 is in the open position. The rotor 50 is moved into the closed position by returning the push plate 58 back to its original retracted position. This causes the ramps 62 to withdraw from the rollers 88 on the retractor frames 84. The compression springs 86 force the retractor frames 84 and the resilient mask seal 74 back to the closed position. The resilient mask seal 74 presses in and seals against the sides of the photo mask 22, without touching the front or back of the photo mask 22. The integrity of the seal formed between the resilient mask seal 74 and the edges of the photo mask 22 may be tested by monitoring gas flow into the sealed space between the resilient mask seal 74 and the photo mask 22, from the gas nozzle 68 or other gas line in the rotor 50.

The lifter is reversed moving the holder 16 back to its load/unload position shown in FIG. 3. The lift/rotate 32 then rotates the head 30 into the head-up position and lifts the head 30 up so that the inflatable seal 66 is within the chamber sidewall 28, as shown in FIG. 3. The inflatable seal 66 is inflated and seals against the chamber sidewall 28. The swing arm 40 moves the liquid spray nozzle 38 over the now up-facing back of the photo mask 22, with the liquid spray nozzle 38 spraying a cleaning liquid onto the back of the photo mask 22. The resilient mask seal 74 prevents any cleaning liquid or vapors from contacting the patterned front of the photo mask 22. An inert gas, such as nitrogen, may be supplied under pressure to the gas nozzle 68 to further prevent any cleaning liquid or vapors from reaching the front of the photo mask 22. The back of the photo mask is typically also rinsed via a rinse liquid from a rinse nozzle on the swing arm, and dried via a drying gas sprayed from a drying gas nozzle on the swing arm. The motor 56 rotates the rotor 50 during cleaning to better distribute the cleaning liquid. During drying the motor 56 may rotate the rotor 50 at higher speed to centrifugally remove liquid from the back of the mask. Drain openings in the chamber sidewall 28 collect and remove used liquids.

After the back of the photo mask has been cleaned and dried, the inflatable seal 66 is deflated, the lift/rotate 32 lowers the head 30 down and out of the chamber sidewall 28, and then rotates the head 30 back to the face-down position. The lifter 20 lifts the holder 16 up to receive the clean photo mask 22. The supply of inert gas via the gas nozzle 68 may continue. The actuators 60 move the push plate 58 towards the rotor 50 with the ramps 62 driving the retractor frames 84 radially outward returning the rotor 50 to the open position wherein the photo mask is released from the resilient mask seal 74.

The actuators 60 may move the resilient mask seal 74 from the closed position to the open position over 5 to 20, 40 or 60 seconds to facilitate drying of the sides of the photo mask via gas flow from the gas nozzle 68. The photo mask is released onto the pins 18. The lifter lowers the holder 16 holding the clean photo mask 22 back down to the load/unload position shown in FIG. 3, where the clean photo mask 22 may be accessed by a robot for loading and unloading the apparatus 10, i.e., for receiving the photo mask from, or transferring the photo mask to, a robot.

As used here, attached means rigidly attached, directly or via one or more intermediate elements. Thus, novel apparatus and methods have been shown and described. Various changes and substitutions may of course be made without departing from the spirit and scope of the invention. The invention, therefore, should not be limited, except to the following claims, and their equivalents.

The invention claimed is:

1. A rotor for holding a photo mask, comprising:
a seal plate having a central opening;
a shaft plate rigidly attached to the seal plate with the shaft plate rotatable about a rotation axis;
a resilient mask seal in the central opening, with the resilient mask seal having first, second, third and fourth sides; and
first, second, third and fourth retractors each including a retractor frame attached to the resilient mask seal, and with each retractor including a spring which continuously urges the retractor frame in an inward radial direction to move the resilient mask seal into a closed position;
at least one actuator movable in a direction parallel to the rotation axis, and with movement of the at least one actuator driving the retractors to move in an outward radial direction, perpendicular to the rotation axis, to move the resilient mask seal into an open position.

2. The rotor of claim 1 with the first and third sides of the resilient mask seal have equal lengths and are perpendicular to the second and fourth sides of the resilient mask seal.

3. The rotor of claim 2 with the first, second, third and fourth retractor frames each having an inner end and an outer end, and with first, second, third and fourth retractor bars at the inner end of the first, second, third and fourth retractor frames, respectively, and the inner end of each retractor bar attached to the resilient mask seal.

4. The rotor of claim 1 with the resilient mask seal having a upper rim attached to the seal plate and a lower rim attached to the shaft plate, and with first, second, third and fourth retractor bars in between the upper rim and the lower rim of the resilient mask seal.

5. The rotor of claim 4 further including a gas nozzle at a center of the shaft plate.

6. The rotor of claim 1 wherein the seal plate is round.

7. Apparatus for cleaning a photo mask, comprising:
a head;
a rotor in the head, with the rotor having a seal plate having a central opening, a resilient mask seal concentric with the rotor, the resilient mask seal in the central opening, and retractors attached to the resilient mask seal and adapted to move the resilient mask seal into an open position;

a spring associated with each retractor for urging that retractor to move the resilient mask seal into a closed position;

a motor in the head linked to the rotor for spinning the resilient mask seal about a central axis of the seal plate;

at least one actuator in the head adapted to operate the retractors;

wherein with the at least one actuator in a first position, the resilient mask seal is in the closed position for sealing against a photo mask, and wherein with the at least one actuator in a second position, the resilient mask seal is in the open position.

8. The apparatus of claim 7 further including a lift/rotate apparatus attached to the head, with the lift/rotate apparatus operable to vertically lift and lower the head, and to rotate the head into a face-up orientation and into a face-down orientation, for moving the head into a process position wherein the head is in the face-up orientation and is engaged with a chamber sidewall for cleaning a photo mask in the rotor, and with the lift/rotate apparatus operable to move the head into a load/unload position, below the process position, for loading and unloading a photo mask into and out of the rotor, wherein the head is in the face-down orientation while in the load/unload position.

9. The apparatus of claim 8 further including a holder having pins and with the holder supported on a lifter and movable vertically via operation of the lifter into an up position for transferring the photo mask to the rotor while the head is in the load/unload position, and with the holder movable vertically via operation of the lifter into a down position, for receiving the photo mask from, or transferring the photo mask to, a robot.

10. The apparatus of claim 8 with the head including a rotor housing and further including a seal on the rotor housing forming a seal against the chamber sidewall, when the head is in the process position.

11. The apparatus of claim 10 further including a nozzle on a swing arm movable over the rotor when the head is in the process position.

12. The apparatus of claim 8 with the resilient mask seal forming a seal against the sides of the photo mask, and with the resilient mask seal not touching the front or back surfaces of the photo mask, when the resilient mask seal is in the closed position.

13. The apparatus of claim 7 with the resilient mask seal having first, second, third and fourth straight sides, and with movement of the at least one actuator in an axial direction from the first position to the second position causing the first, second, third and fourth sides to simultaneously move outwardly by 0.5 to 5 mm.

14. The apparatus of claim 7 wherein the seal plate is round and the resilient mask seal is square and is concentric with the seal plate.

15. Cleaning apparatus comprising:

a head supported on a lift/rotate apparatus operable to vertically lift and lower the head, and to rotate the head into a face-up orientation and into a face-down orientation;

a rotor in the head, the rotor including a seal plate having a resilient mask seal;

first, second, third and fourth retractors attached to the resilient mask seal;

a motor in the head linked to the rotor for spinning the rotor about a rotation axis;

one or more actuators in the head movable in a direction parallel to the rotation axis, and with movement of the actuators causing the first, second, third and fourth retractors to move radially outward, in a direction perpendicular to the rotation axis.

16. The cleaning apparatus of claim 15 wherein the resilient mask seal is concentric with the seal plate.

17. The cleaning apparatus of claim 15 further comprising a spring biasing each retractor inwardly towards the rotation axis.

* * * * *